United States Patent [19]
Hansen et al.

[11] 3,986,054
[45] Oct. 12, 1976

[54] HIGH VOLTAGE INTEGRATED DRIVER CIRCUIT

[75] Inventors: Aage A. Hansen; Ralph D. Lane, both of Wappingers Falls, N.Y.

[73] Assignee: International Business Machines Corporation, Armonk, N.Y.

[22] Filed: Jan. 27, 1975

[21] Appl. No.: 544,080

Related U.S. Application Data

[62] Division of Ser. No. 405,617, Oct. 11, 1973, Pat. No. 3,898,630.

[52] U.S. Cl. .............................. 307/270; 307/238; 307/DIG. 4; 307/DIG. 5; 340/173 R
[51] Int. Cl.² ................ H03K 5/153; G11C 11/40; H03K 19/08; H03K 19/36
[58] Field of Search ...... 307/205, 270, 238, DIG. 4, 307/DIG. 5; 340/173 R

[56] References Cited
UNITED STATES PATENTS

| | | |
|---|---|---|
| 3,609,712 | 9/1971 | Dennard .......................... 307/279 X |
| 3,685,027 | 8/1972 | Allen et al. ...................... 307/238 X |
| 3,702,926 | 11/1972 | Picciano et al. ................. 307/205 X |
| 3,718,826 | 2/1973 | Donofrio et al. ..................... 307/251 |
| 3,778,784 | 12/1973 | Karp et al. ....................... 307/238 X |
| 3,795,898 | 3/1974 | Mehta et al. ..................... 307/238 X |
| 3,796,893 | 3/1974 | Hoffman et al. ..................... 307/205 |
| 3,843,954 | 10/1974 | Hansen et al. .................. 307/270 X |

OTHER PUBLICATIONS

De Simone, "Low–Power MOSFET Decoder"; *IBM Tech Discl. Bull.*, vol. 13, No. 1, pp. 260–261; 6/1970.

*Primary Examiner*—John S. Heyman
*Assistant Examiner*—Larry N. Anagnos
*Attorney, Agent, or Firm*—Theodore E. Galanthay

[57] ABSTRACT

Disclosed is a high voltage driver circuit for writing information into a read mostly memory array, the memory cells of the array being characterized by requiring much higher potential levels for writing information than for reading information.

3 Claims, 5 Drawing Figures

HIGH VOLTAGE INTEGRATED DRIVER CIRCUIT

This is a division of applicaiton Ser. No. 405,617 filed Oct. 11, 1973 now U.S. Pat. No. 3,898,630.

Cross Reference to Related Patent Applications and Patents

1. High Voltage Integrated Driver Circuit and Memory Embodying Same by Aage A. Hansen et al, application Ser. No. 319,966 filed on Dec. 29, 1972, and assigned to the assignee of the presenst application.
2. Decoder Driver Circuit for Monolithic Memories by George Sonoda, application Ser. No. 267,302 filed on June 29, 1972, and assigned to the assignee of the present application.
3. Electrically Erasable Floating Gate FET Memory Cell by Shakir A. Abbas et al, application Ser. No. 341,814 filed on Mar. 16, 1973, and assigned to the assignee of the present application.

BACKGROUND OF THE INVENTION

1. Field of the Invention

This invention relates to a high voltage integrated driver circuit for driving the respective bit lines of a digital computer memory array of floating gate avalanche-injection transistor cells to cause the latter to undergo avalanche breakdown so as to change the floating gate of the selected cell and thereby store on bit of information in the latter. Driver circuits in accordance with the present invention may also be utilized in other applications where a high voltage output swing is required. The present invention also relates to an overall memory array comprising high voltage drivers for the bit lines and the word lines in an array of memory cells each requiring a high voltage for writing information and a low voltage for reading information. Such memory arrays have been commonly referred to as read mostly memories.

2. Description of the Prior Arts

In the prior art of digital computer memories, there has recently been developed a memory cell comprising a transistor with a floating gate charged by avalanche injection. This type of memory cell is called a "floating-gate avalanche-injection metal oxide semiconductor", otherwise known as a "FAMOS" device. This memory cell as well as a word line drive circuit therefore is disclosed in the aforementioned cross referenced U.S. Pat. applicaton by Hansen et al, and is also disclosed in a paper by D. Frohmann-Bentchkowsky entitled, "A Fully-Decoded 2048-Bit Electrically-Programmable MOS ROM", 1971, ISSCC International Solid State Circuits Conference, Feb. 18, 1971.

This memory cell is electrically programmed by applying a high voltage to the respective word line and bit line to cause a PN junction to breakdown so that charge carriers flow to the floating gate and thereby charge the latter. The cell may thereby store a bit of information whose binary value is indicated by the presence or absence of charge on the floating gate. In order to cause the PN junction to undergo avalanche breakdown, it is necessary to drive the word line with a voltage swing which is relatively large compared to the voltages normally utilized in integrated circuits.

The word line driver circuit described in the aforementioned cross referenced patent application by the inventors of the present invention utilizes a combination of bipolar and field effect transistor technology also known as BIFET technology. The processing of integrated circuits including both bipolar and field effect transistors is inherently more complex than the processing of semiconductor chips containing only field effect transistors (FETs). For this reason, a need developed for high voltage driver circuits including only FETs. Moreover, a need developed for such a circuit for driving the bit line during a write cycle and for the same circuit to select the bit line for the read cycle.

SUMMARY OF THE INVENTION

Accordingly, it is an object of this invention to provide an improved high voltage driver circuit.

It is another object of this invention that the high voltage drive circuit be adapted to both drive a bit line during a write cycle and select a bit line during a read cycle.

It is still another object of this invention that the drive circuit utilize minimal power.

It is a further object of this invention that the high voltage drive circuit of this invention be comprised of integrated circuits of the same semiconductor processing technology such as field effect transistors.

It is still a further object of this invention to provide an improved FAMOS memory.

In accordance with the present invention, a circuit is provided for personalizing a memory cell by avalanche injection. Since the potentials required for writing into such a memory cell are also high enough to cause avalanche breakdown in the junction of the various circuit elements included in the driver circuits, special features are provided in the design of the present circuit to inhibit junctions that are exposed to high voltages from avalanching. The avalanche inhibiting scheme presently disclosed includes a feedback path and interrupts avalanche breakdown where high voltage paths occur and avalanche is undesirable.

Another feature of the present circuit is that it is useful both in the writing and reading modes of operation. The read mostly memory constructed in accordance with the present teachings may be "personalized" at the factory or at the customer's installation by the high voltage driver circuit of the present invention. This personalized read only memory is then operable in the customer's installation in a read only mode by the same circuits used for writing. This is accomplished by a "device eliminate" technique which for read operations turns off the driving transistor enabling charge from the memory cell to flow into the bit line to change its voltage sufficiently to be sensed by the sense amplifier.

A further feature of the overall memory configuration disclosed herein is that half selected cells are protected, eliminating "avalanche disturb" conditions. This is a condition that occurs if the word line is left floating when the memory cell is half selected. This avalanche disturb condition is eliminated by connecting the word line of unselected memory locations to its up level (DC ground) when the bit line is selected.

A still further feature of this invention is its dynamic mode of operation, minimizing power consumption.

The foregoing and other objects, features and advantages of the particular description of the preferred embodiments of the invention as illustrated in the accompanying drawings.

DESCRIPTION OF THE PREFERRED EMBODIMENTS

Figure 1:
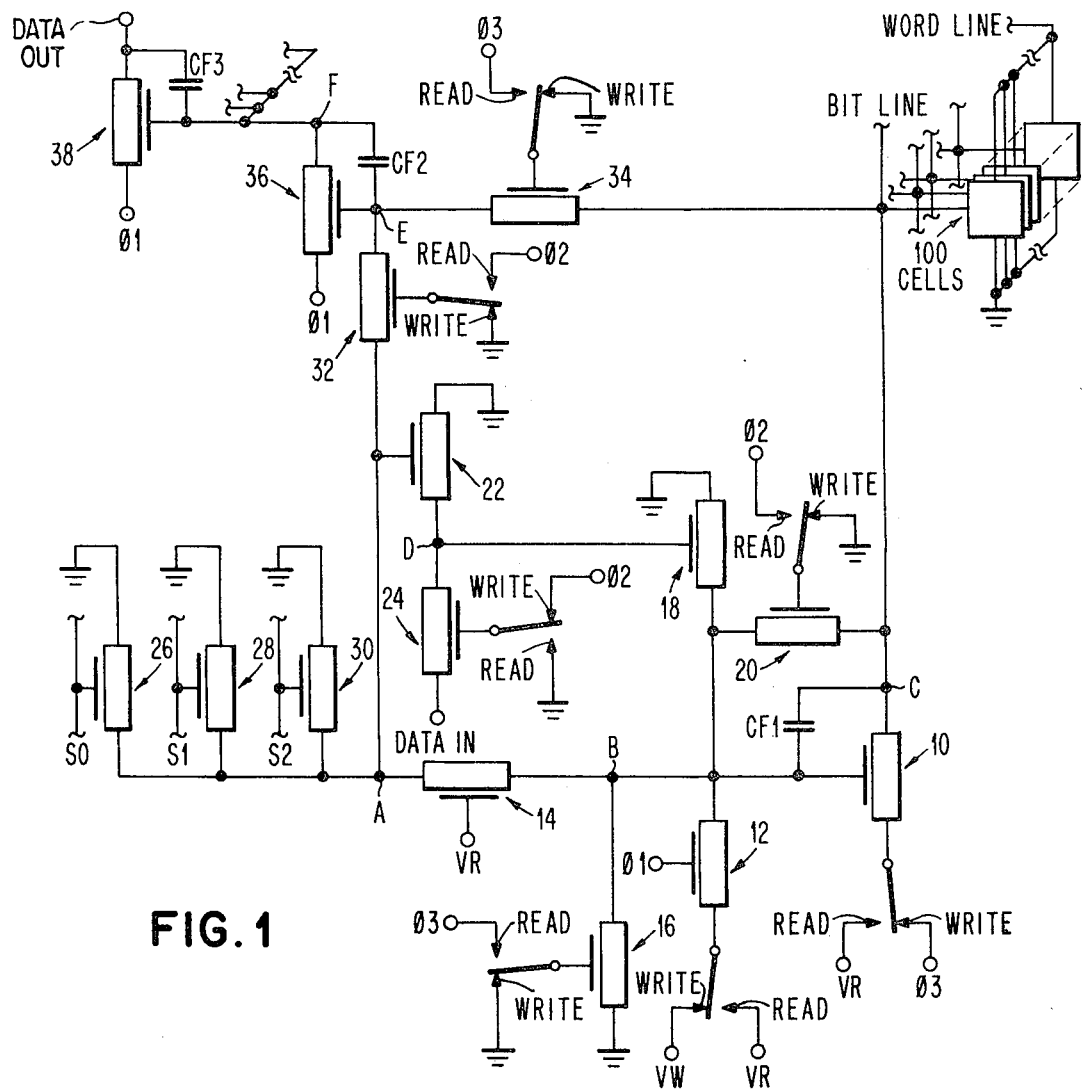
FIG. 1 is a schematic circuit diagram of the bit driving and sense circuit of the present invention.

Refer now to FIG. 1 for a description of the bit line driving and sense circuit connected to an array of cells. It should be noted at the outset that this circuit is intended to both write information into and read information out of memory array 100. For a write operation, the circuit is normally connected to a first set of terminals. Once the information has been written, the memory array will effectively operate as a read only memory (ROM), the present circuit being connected to the potentials indicated at the read terminals. This dual mode operation has been represented by a set of switches which are shown connected in the write mode of operation. It is noted that all switches are either in the write or read position depending upon the particular desired mode of operation. In the present example, p channel field effect transistors are utilized to obtain the potential polarities desired for the particular memory cells. Those skilled in the art will recognize that the circuit could also be embodied in n channel field effect transistors with a corresponding variation in the polarity of the applied potential levels and variation of the relative terms of charging and discharging capacitances. It is further recognized that field effect transistors having drain, source and gate electrodes are bidirectional devices such that the terms drain and source are relative depending on the particular bias levels applied. For this reason, the present description will more generically refer to the herein utilized field effect transistors as having a control electrode and first and second controlled electrodes. More specifically, the gate electrode may be referred to as a gating electrode while the source and drain electrodes may be referred to as first and second gated electrodes.

With continued reference to FIG. 1, the bit line driving circuit includes transistors 10 to 24. Driving transistor 10 has a gating electrode electrically connected to node B, a gated electrode connected to node C which forms part of the bit line, and a second controlled electrode connected to either a read or write terminal depending on the desired mode of operation. Transistor 10 provides an impedance across its two gated electrodes depending on the potential level applied to its gating electrode. For the p channel field effect transistor illustrated herein, a more negative potential applied to the gating electrode tends to turn transistor 10 (on) placing it in a low impedance state while a relatively more positive potential applied to the gating electrode tends to turn transistor 10 (off) placing it in its high impedance state. Transistor 10 has a feedback capacitor CF1 connected between the gating electrode and the first gated electrode providing a feedback signal in a well known manner during the write operation. During the write operation, the first controlled electrode of transistor 10 is a source electrode such that capacitor CF1 is connected from the gate to source. Also electrically connected to the gated transistor 10 is restore transistor 12 for providing the restore pulse to charge the control electrode of transistor 10. Transistor 12 has a first gated electrode connected to node B, a second gated electrode connected to either a write or read terminal depending on the desired operation, and a gate electrode connected to the phase 1 pulse terminal. It is noted that the time of occurence and potential levels of the phase 1, phase 2, and phase 3 wave forms differ between read and write operations as will be described in greater detail. During the write operation, the phase 1 pulse is also referred to as a restore pulse to charge the control electrode of transistor 10 to an initial voltage level prior to activation of the phase 3 pulse source which is connected to one of the gated electrodes of transistor 10.

Isolation transistor 14 has its gated electrodes connected between nodes A and B and its gating electrode connected to potential terminal VR. Transistor 16 has its gated electrodes connected between node B and ground potential and its gating electrode connected to either a read or write terminal. In the write mode of operation, the gating terminal is grounded preventing transistor 16 from effecting the circuit. In the read mode of operation the gating electrode of transistor 16 is connected to the phase 3 pulse bringing node B to a ground potential during phase 3 time. Also connected between node B and ground are the gated electrodes of transistor 18. The gating electrode of transistor 18 is connected to node D. Transistor 20 has its gated electrodes connected between node B and the bit line. The gating electrode of transistor 20 is connected either to the read or write terminal, depending on the mode of operation. During write, the gating electrode of transistor 20 is grounded preventing it from effecting the circuit. During the read mode of operation, the gating electrode to transistor 20 is connected to the phase 2 clock pulse providing a "device eliminate" function to be described later. Node D is a common point between one of the gated electrodes of each of transistors 22 and 24. The other gated electrode of transistor 22 is connected to ground while the other gated electrode of transistor 24 receives the data input to be written into the cells. The gating electrode of transistor 22 is connected to node A while the gating electrode of transistor 24 is connected to either the read or write terminal depending on the desired mode of operation. During read time, the gating electrode of transistor 24 is connected to ground keeping transisor 24 off since no valid data input is expected during read time.

In order to select the circuit of FIG. 1; for either reading or writing of cells 100, all of decode transistors 26, 28, and 30 must be off. These three decode transistors, it being recognized that additional ones may be placed in parallel therewith, have their gated electrodes connected between ground potential and node A. Their gating electrodes are connected to respective select lines. In order to select the present bit line driving circuit, all of the gating select signals S0, S1, and S2 must be at an up level to keep transistors 26, 28, and 30 off preventing node A (and node B) from being brought to ground level. If any of the gating select signals are at a down level at phase 2 time turning any one of transistors 26, 28, or 30 on, node A will be brought to ground level preventing transistor 10 from conducting during phase 3 of write time and preventing writing of new information into the associated cell.

With continued reference to FIG. 1, the sensing circuit includes transistors 32 to 38. Transistor 32 has its two gated electrodes connected between nodes A and E, while its gating electrode is connected to either the read or write terminal depending on the desired mode of operation. Transistor 34 has its gated electrodes connected between the cells and node E while its gating electrode is connected to either a read or write terminal depending on the desired mode of operation. Note that the connection of the gated electrode of transistor 34 to the cells is also a connection to the bit line (bit-/sense lines being common in this configuration), the same gated electrode of transistor 34 being also an electrical connection to node C. Note that the gating electrodes of both transistor 32 and 34 are connected to ground potential in the write mode of operation keeping them in their high impedance state. Transistor 36 has its gated electrodes connected between node F and a phase 1 terminal while its gating electrode is connected to node E. Transistor 38 also has one of its gated electrodes connected to a phase 1 terminal while its other gated electrode provides the data output that has been read from the cell. The gating electrode of transistor 38 is connected to node F. Each of transistors 36 and 38 have a feedback capacitance CF2 and CF3, respectively connected in parallel with their gate to source paths to overcome the threshold voltage drops of these transistors.

Figure 2:
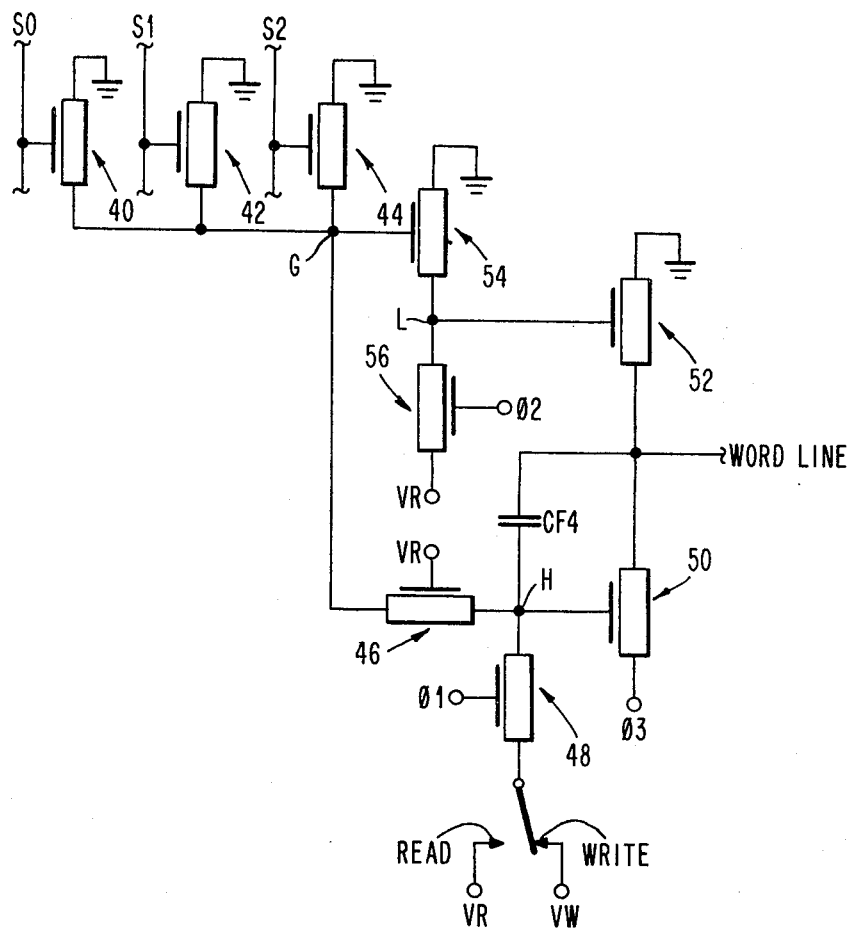
FIG. 2 is a schematic circuit diagram of the word line driver in accordance with the present invention.

The foregoing describes the bit line driving and sensing arrangement in accordance with the present invention. In order to access a particular cell within the array of cells 100 a word line must also be activated. The word line circuit is illustrated in FIG. 2. Decode transistors 40, 42, and 44 have their gated electrodes connected between ground potential and node G. As for the bit line driving circuit, any number of decode transistors may be placed in parallel. The gating electrodes of decode transistors are connected to a select signal such as S0, S1, and S2. In order to select the particular word line driving circuit of FIG. 2, all of the select signals must be at ground potential at least during phase 2 time in order to keep all of transistors 40, 42, and 44 off. This prevents bringing node G (and H) from being brought to ground potential prior to the occurrence of the phase 3 clock pulse. Isolation transistor 46 has its gated electrodes connected between nodes G and H and its gating electrode connected to terminal VR. Transistor 48 has its gated electrodes connected between node H and either the read or write terminal depending on the desired mode of operation. The gating electrode of transistor 48 is connected to the phase 1 clock terminal. The gating electrode of transistor 50 is also connected to node H while its gated electrodes are connected between the phase 3 clock pulse and the word line. Transistor 50 has a feedback capacitor CF4 connected in parallel with its gate to source path as the previously described feedback capacitors. Also connected to the word line is one of the gated electrodes of transistor 52, the other gated electrode being connected to ground. The gating electrode of transistor 52 is connected to node L which forms a common point between one of the gated electrodes of each of transistors 54 and 56. The other gated electrode of transistor 54 is connected to ground potential while the other gated electrode of transistor 56 is connected to potne-tial terminal VR. The gating electrode of transistor 54 is connected to node G while the gating electrode of transistor 56 is connected to the phase 2 clock terminal.

Figure 5:
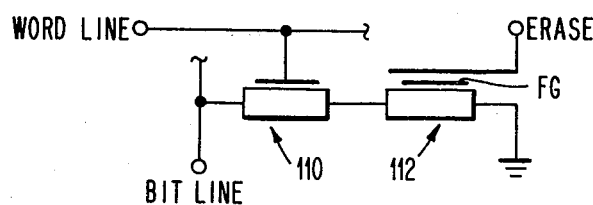
FIG. 5 is a schematic circuit diagram of a particular memory cell constituting one data bit position in an array of memory cells.

The structure and operation of the floating gate avalanche injection metal oxide semiconductor "FAMOS" memory cell are disclosed in the cross referenced patent application by the present inventors, references in the said patent application, the cross-referenced Abbas et al application, and the article referenced above. For this reason the cell per se is described only briefly with respect to FIG. 5 of the present application. Referring to FIG. 5, there is shown a schematic circuit diagram illustrating a single memory cell comprising a decode (or "cross point") transistor 110 and a floating gate avalanche injection metal oxide semiconductor "FAMOS" transistor 112. One of the gated electrodes of decode transistor 110 is shown connected to one of the gated electrodes of the FAMOS transistor although in actual practice these two diffusions (source and drain) are embodied in a single diffusion region. The other gated electrode of the decode transistor is connected to a bit line also referred to as a bit/sense line, and the gating electrode of the decode transistor is connected to a rspective word line WL. The floating gate FG of the FAMOS transistor is unconnected and insulated, and the other gated electrode of the FAMOS transistor is connected to ground. Additionally there is disclosed an erase electrode generally superimposed over the floating gate FG and connected to an erase terminal in the event it is desired to erase the particular information stored in the FAMOS transistor. It is again noted that the memory cell of FIG. 5 is being described for the sole reason of gaining a more thorough appreciation for the function of the bit line and word line driver circuits. In the operation of the disclosed memory cell, a much higher potential is required for writing information than for reading. In order to perform a write operation so as to store a charge on floating gate FG, a large negative voltage of about 25 volts is applied to both the bit line and the word line connected to the selected cell. This brings the common node between transistors 110 and 112 also to approximately minus 20 volts thereby causing FAMOS transistor 112 to go into avalanche breakdown permanently storing the negative charge in floating gate FG thereby permanently maintaining transistors 112 in its on state. Thereby, during any subsequent read operation when the word line is brought negative rendering transistor 110 conductive, the bit line is brought to near ground potential indicating the storage of a logical 1. In the alternative, if a logical 0 is stored, transistor 112 is permanently in its off state such that the turning on of transistor 110 by a negative signal on the word line will not bring the bit line to ground potential. It should be recognized in the foregoing that by "permanent storage" is meant until such time as an appropriate erase pulse is applied to the erase terminal removing the excess negative charge on the floating gate FG. It is also known to remove any stored charge by other means such as ultraviolet radiation.

OPERATION

In the operation of the circuits disclosed herein, it should be kept in mind that an important feature is provided by the same bit line driver circuit being useful both for reading and writing. For this reason the circuit has to be capable of operating in two distinct environments. In the write environment, very high potentials are utilized requiring the herein disclosed circuits to be protected from the same avalanche breakdown phenomenon that is intended to be produced in the memory cell. In the read mode, normal FET voltage levels are utilized requiring the ability to sense relatively small signal differences and relative insensitivity to noise. Furthermore, since a read mostly memory array is normally comprised of a plurality of cells, only a few of which are selected during a particular memory operation, the disclosed circuits must operate satisfactorily both in the selected and unselected state. This becomes important for example, when avalanche breakdown might be inadvertently induced in the various transistors exposed to very high potentials. Lastly, in order to minimize DC power dissipation, a dynamic mode of operation is utilized. However, because of the differences between the write and read modes of operation, different potential levels and timing relationships are provided between the read and write modes of operation and even several of the steady state applied voltages differ. Also, as is normal in any binary logic circuit, the conductive states of the various transistors differ depending on whether a logical 0 or 1 is stored. For this reason, to facilitate the explanation of the operation, specific illustrative examples are utilized.

Figure 3:
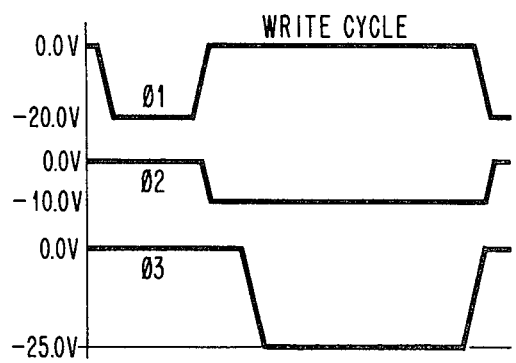
FIG. 3 is a waveform diagram illustrating the operation of the herein disclosed circuits during a write cycle.

Refer now to FIGS. 1 and 3 for a description of the operation of the circuit of FIG. 1. For purposes of example assume that the steady state potential for reading VR is minus 10 volts while the steady state potential for writing VW is minus 20 volts. The third steady state applied potential is 0 volts or DC ground. The pulsating applied potentials and their time of occurrence is as shown in the wave form diagram of FIG. 3. Assume first the case in which it is desired to write a logical 0 and the particular bit line driver circuit of FIG. 1 is selected. In order to select the circuit of FIG. 1, all the decode transistors including 26, 28 and 30 receive up level (0 volts for example) signals at the gating electrode maintaining them in their high impedance state. For this reason node A is maintained floating. In order to write a logical 0, the data input terminal at one of the gated electrodes of transistor 24 is brought to a down level of approximately minus 10 volts. (A logical 0 would be indicated by an up level data input signal of approximately 0 volts) All the transistors having means for selectively being connected either to a write or a read terminal are connected to a write terminal as shown. In practice, this could mean that the circuit of FIG. 1 is "plugged in" to a source of potentials and pulses as shown with the switches in the write position. Transistors 16, 20, 32 and 34 having their gating electrodes connected to an up level (DC ground) are maintained off throughout the wirte operation. At the occurrence of the down level of the phase 1 timing pulse, transistor 12 is turned on bringing node B to approximately minus 15.0 volts. In the event that transistor 18 is "on" at this point, it is possible to have an undesirable DC current path from ground to VW through transistors 18 and 12. This undesirable condition, however, is only momentary since as node B is brought to minus 15 volts, the feedback path through transistor 14 brings node A to a down level turning transistor 22 "on" bringing node D to ground potential turning transistor 18 "off". Next, the data input of minus 10 volts must be present at the data in terminal to transistor 24 no later than phase 2 time. At the occurrence of the down level of phase 2, (coinciding with the up going transition of the phase 1 pulse) transistor 24 is turned on while transistor 12 is turned off. Since transistor 22 is still on at this time, a voltage divider effect occurs between transistors 22 and 24. The width to length ratios of the channel regions of these two transistors are chosen such that node D is brought to approximately minus 6 volts at this time turning transistor 18 on. When transistor 18 is turned on, node B is returned to ground potential bringing node A near ground potential turning transistor 22 off permitting node D to come to a potential level of approximately 8 to 8½ volts. Next, while the phase 2 pulse remains at the down level, the phase 3 pulse comes down to minus 25 volts nevertheless with no effect on node C and the bit line since transistor 10 is being maintained off by a ground level potential at node B. It is important here to note that the potential of minus 25 volts intended to cause avalanche breakdown in a selected memory cell in which it is desired to write a 1 is a sufficiently high potential to potentially also cause avalanche breakdown in transistor 10. In order to avoid such an undesirable condition, a DC path to ground is provided from the gating electrode of transistor 10 through transistor 18 which is "on", thereby preventing the accumulation of avalanche breakdown charge on the gating electrode of transistor 10. Whenever a logical 0 is to be written into a selected cell, node B will be brought to an up level, as has been described causing the feedback path through isolation transistor 14 to turn transistor 11 off assuring that node D is at a down level maintaining transistor 18 and the associated current path to DC ground open.

In an alternative example, it is desired to write a logical "1" into the memory array by way of the bit line driver circuit of FIG. 1. Data input is maintained at its up level (DC ground) prior to phase 2 pulse. In this alternative, at the occurrence of the phase 2 pulse (and termination of the phase 1 pulse), when transistor 24 and 22 are turned "on" and transistor 12 is turned "off", node D is maintained at ground potential keeping transistor 18 off. Thus, node B is maintained at approximately minus 15 volts. Thus, at the occurrence of the phase 3 drive pulse, driver transistor 10 is rendered conductive bringing node C to a down level. The feedback capacitance CF1 causes this down level potential to be fed back to the gating electrode of transistor 10 such that the potential at node B may become approximately minus 35 volts permitting the full minus 25 volts applied by the phase 3 clock pulse to be transmitted to node C and the selected FAMOS memory cell. It is important here to note that the potential of minus 35 volts on node B can cause an undesirable avalanche breakdown charge on the gating electrode of transistor 12, 16, 18 and 20. The avalanche breakdown of transistors 16 and 20 is prevented by external connection to an up level (DC ground) as previously described, thereby preventing the accumulation of avalanche breakdown charge on their gating electrode. The gating electrode of transistor 12 is connected to phase 1, which is at its up level (DC ground) thereby preventing accumulation of avalanche breakdown charge on the gating electrode. In order to avoid avalanche breakdown of the gating electrode of transistor 18, an avalanche protect scheme is built into the circuit disclosed. A DC path to ground is provided from the gating electrode of transistor 18, through transistors 22 and 24 which are maintained on as previously described, hence protecting from avalanche breakdown charge on the gating electrode of transistor 18.

With continued reference to FIGS. 1 and 3, the case where the bit line circuit of the present invention is nonselected will be discussed. In this condition, during phase 2 time, one or more of the select signals such as S0, S1, S2 are at a down level turning on one or more of the decode transistors such as 26, 28 and 30. This brings node A to ground potential during phase 2 time. Through isolation transistor 14, node B is also brought to ground potential. This assures that transistor 10 will be maintained in its off condition. Also during phase 2 time transistor 24 is turned on. In the event that a logical 0 is present at the data in terminal, minus 10 volts is applied causing node D to be brought to a down level turning transistor 18 on. This provides a current path to DC ground from the gating electrode of transistor 10 to prevent transistor 10 from undergoing avalanche breakdown during the occurrence of the phase 3 clock pulse. In the alternate event that a logical 1 represented by a ground level potential is presented at the data in terminal, node D is maintained at ground potential keeping transistor 18 off. In this event a current path from node B through transistor 14 through the on transistor (s) 26, 28, and 30 provides a current path to DC ground. This latter path, of course, is also available regardless of the logical data in. It is here noted that the select signals of S0, S1, S2, occur at least during the same time as the phase 2 clocking pulse and (with reference to FIG. 3) it is noted that the phase 2 clocking pulse completely overlaps the phase 3 clock pulse.

Refer now to FIG. 2 for a description of the word line driver circuit during a write operation. In the case where the particular word line drive circuit of FIG. 2 is selected, all of the select transistors including transistors 40, 42, and 44 are maintained off by up level select pulses S0, S1, and S2 respectively. Node G, therefore, is left floating. At the occurrence of the phase 1 pulse, transistor 48 is turned on transmitting potential VW to node H. In the present example, VW being approximately minus 20 volts and phase 1 being approximately minus 20 volts when it occurs, brings node H to one threshold drop below minus 20 volts such as 15 volts for example. Through isolation transistor 46, this brings node G to a down level turning transistor 54 on bringing node L to ground potential. The occurrence of the phase 2 clock pulse turns transistor 56 on also. However, the impedance ratios of transistors 54 and 56 are chosen such that the impedance of transistor 56 is higher such that transistor 52 is maintained in the off state at all times while transistor 54 is on. The occurrence of the phase 3 clock pulse then brings the word line to minus 25 volts bringing the gating electrode of transistor 110 FIG. 5 to minus 25 volts which is required if transistor 112 is to undergo avalanche breakdown. It is here noted that transistor 52 FIG. 2 might also undergo avalanche breakdown, but for its gating electrode being held to DC ground through node L and conductive transistor 54 is protected from avalanche breakdown charge on the gating electrode of transistor 52. The feedback path through capacitor CF4 not only assures that node H will be sufficiently negative to overcome the threshold voltage drop of driver transistor 50 but also assures that node G will remain down and transistor 54 will remain on in order to perform the avalanche protect function with respect to transistor 52.

With continued reference to FIG. 2 consider the alternate case in which the word line driver circuit is not selected. In this alternate case, one or more of the select transistors including 40, 42 and 44 is rendered conductive by a down level pulse on one of the associated select lines. This brings node G to ground potential turning transistor 54 off. Through isolation transistor 46, node H is also maintained at ground level keeping transistor 50 off. At the occurrence of the phase 2 pulse, node L is brought to a down level through conducting transistor 56. With transistor 54 off node L is brought to a down level sufficient to turn transistor 52 on. Thus, the word line is brought to ground potential. This ground potential is uneffected by the occurrence of the phase 3 pulse since driver transistor 50 is maintained in its off position. Transistor 50 is protected from avalanche breakdown by the DC ground connection through node H, transistor 46, and the conductive transistor (s) in the decode section including transistors 40, 42, and 44. An important additional point to recognize here is that the word line is also clamped to DC ground through conductive transistor 52. Thus, in the event that in the XY selection scheme of memory cells the bit line is brought to minus 25 volts at this time, transistor 110 is protected from avalanche breakdown by the current path through transistor 52 to DC ground.

Having described the write mode of operation, the read mode of operation will now be described. Refer first to FIG. 5 for description of the overall desired function. In order to access the information stored in FAMOS transistor 112, transistor 110 is rendered conductive by a negative signal on its gating electrode provided by the word line. This negative potential is a normal FET level such as minus 10 volts for example. Note that in reading, no avalanche breakdown is desired so that no avalanche breakdown voltage levels are required or desired. In the event that a logical 1 is stored in the selected cell, then transistor 112 is in its low impedance state such that when transistor 110 is also placed in its low impedance state, the bit line will be charged to ground potential which is sensed by the sense circuitry also connected to the bit line. It will be noted that for this reason this particular bit line is frequently referred to as a bit/sense line. In the alternative, if a logical 0 is stored, transistor 112 will be in its high impedance state such that when transistor 110 is turned on, the bit line remains at its previously established potential.

Figure 4:
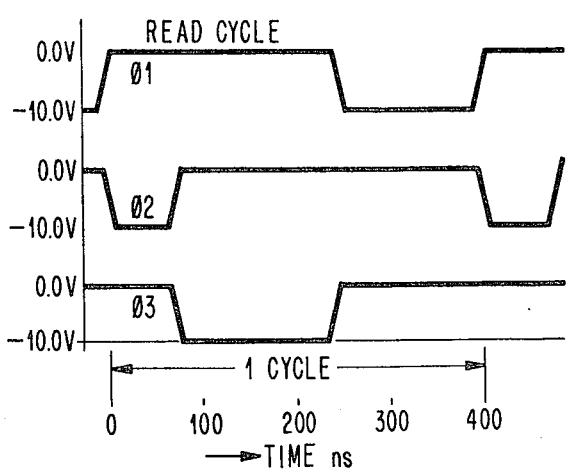
FIG. 4 is a waveform diagram illustrating the operation of the herein disclosed circuits during a read cycle.

Refer now to FIGS. 2 and 4 for the operation of the word line driver circuit for turning on the associated transistor 110 by providing a negative potential on the word line. Note that the gated electrode of transistor 48 previously connected to the write terminal is now connected to the read terminal providing a potential VR which was for the purposes of the present example defined at minus 10 volts. Assume first that the particular word line driven by the word line driver of FIG. 2 is to be selected. In this event, all the select transistors including 40, 42 and 44 are maintained in their off state leaving node G (and also node H) floating. The occurrence of the phase 1 pulse will precharge node H to one threshold level below VR and node G to the same negative potential tending to turn transistors 50 and 54 on. Since the phase 3 clock pulse at this time is at ground potential, the word line will be brought to ground potential (if not already at ground potential) by conduction through transistor 50. The occurrence of the phase 2 clock pulse (coincident with the termination of the phase 1 clock pulse) turns on transistor 56 but node L remains near ground potential since transistor 54 is still on based on the previously described relative impedance levels of transistors 54 and 56. Accordingly, transistor 52 remains off. Next, the phase 3 clock pulse occurs bringing the word line dwn to minus 10 volts. In the alternative case if the particular circuit of FIG. 2 is not to be selected, then node G will be brought to ground potential during phase 2 time also bringing node H to ground potential (isolation) through conducting transistor 46. This keeps transistor 50 off during phase 3 time. At the same time, transistor 54 is kept off permitting node L to be brought to a down level by the conduction of transistor 56 during phase 2 time. This permits transistor 52 to turn on to maintain the word line at ground potential. The foregoing describes the accessing of a particular desired transistor or group of transistors 110 by the word line.

In order to sense the resultant state of the bit line refer now to the sensing cicuitry illustrated in FIG. 1 which is operated in accordance with the waveforms of FIG. 4 as will now be described. Note in the FIG. 1 embodiment that all the gated terminals of the various transistors which were previously connected to the write terminal are now connected to the various read terminals. Accordingly, transistor 24 always having its gate electrode connected to ground potential will be maintained in its off state throughout the read operation. Incidentally, this particular arrangement of transistor 24 in combination with the remainder of the circuitry permits the data in and data out terminals to actually be identical terminals conserving physical space on the semiconductor substrate. As in the previous example, assume that the particular bit line illustrated in FIG. 1 is to be sensed. In that event, all of the decoding transistors including 26, 28, and 30 are maintained off by appropriate select signals. Node A is therefore floating. At the occurrence of the phase 1 pulse, transistor 12 is turned on bringing node B to a down level and also node A through isolation transistor 14. This turns on transistors 22 and 10. Also note that this conditions one of the gated electrodes of transistors 36 and 38 negatively. This actually operates to read out at the data out terminal the bit associated with the previous read cycle. Accordingly, the present read cycle actually commences with the occurrence of the phase 2 pulse. The occurrence of the phase 2 pulse turns on transistors 20 and 32. An important aspect of the invention is illustrated by the turning on of transistor 20 which effectively equalizes the potential between nodes B and C, the gate and source terminals of transistor 10. This effectively turns transistor 10 off and eliminates it from effecting the potential on the bit line during the down swing of the phase 3 pulse. Since transistor 32 is also "on" as well as isolation transistor 14, all the potentials between the bit line, node C, node B, node A, and node E are substantially equalized. Since during phase 1 transistor 12 connected node B to the minus 10 volts VR supply, this substantially equal potential is a negative potential of approximately minus 8 volts. There is, of course, some variation because of the threshold voltage drop across several of the transistors.

At the termination of the phase 2 pulse, transistors 32 and 20 are turned off. This coincides with the occurrence of the phase 3 clock pulse turning transistors 16 and 34 on. The turning on of transistor 16 assures that node B is returned to ground level keeping transistor 10 off such that the phase 3 pulse at the drain electrode of transistor 10 will continue to have no effect. At the same time transistor 34 is turned on permitting node E to be brought to ground potential, in the event that the cell stored a logical 1 providing a connection through to ground. Of course, in the event that the cell was storing a logical 0, the potential on node E is uneffected by "on" transistor 34 and it will remain at its previously precharged negative level. In the event that a 1 is stored and node E is brought to ground potential, then the subsequent phase 1 pulse will render neither transistor 36 nor transistor 38 conductive providing no negative drive current to the data output indicating that a logical 1 is stored. In the event that a logical 0 is stored and node E is maintained in its precharged negative level, then the occurrence of the phase 1 pulse will charge node F negative turning transistor 38 on. The occurrence of the same negative phase pulse will then cause a negative drive pulse on the data output terminal indicating the storage of a logical 0. The feedback capacitors CF 2 and CF 3 operate in their conventional manner.

With continued reference to FIGS. 1 and 4 assume lastly that the bit line circuit of FIG. 1 is unselected resulting in nodes A, B, C and E being brought to ground potential by the on condition of one or more of the selected transistors such as 26, 28, and 30. At the occurrence of the phase 2 pulse transistors 32 and 20 are turned on. Thus when transistor 110, FIG. 5, were to be turned on by a word line signal during phase 3 time, the cell consisting of transistors 110 and 112 could have a potential such as minus 6 volts, for example, from a previous selected cycle at the common node between transistors 110 and 112 which is possible if transistor 112 is in its high impedance state. Because the capacitance on the common node between transistors 110 and 112 is very small compared with the capacitance on the bit line, the bit line potential will equalize at about ground potential, and not cause a false read out.

What has then been described is a field effect transistor circuit for providing very high potentials sufficient to cause avalanche breakdown in floating gate avalanche injection storage devices.

While the invention hs been particularly shown and described with reference to preferred embodiments, thereof, it will be understood by those skilled in the art that various changes in form and detail may be made therein without departing from the spirit and scope of the invention.

What is claimed is:

1. A high voltage integrated driver circuit comprising:
   a transistor having a control electrode, first and second controlled electrodes, and an impedance between said controlled electrodes being variable in response to one of several potential levels applied to the control electrode;
   means for selectively interconnecting said control electrode to one of said several potential levels thereby adjusting the impedance of said transistor to a predetermined level;
   means for interconnecting said first controlled electrode to an output;
   means for selectively interconnecting said second controlled electrode either to a steady state potential level or to a pulse source having one of two potential levels, one of the two potential levels of said pulse source being sufficient to cause avalanche breakdown in said transistor; and means connected to the control electrode of said transistor for providing a current path to prevent the accumulation of avalanche breakdown charge.

2. A high voltage integrated driver circuit as in claim 1 wherein:

said transistor is a field effect transistor;
said first controlled electrode is a source electrode;
said second controlled electrode is a drain electrode; and
said control electrode is a gate electrode.

3. A high voltage integrated driver circuit as in claim 1 further comprising:

means for applying a restore pulse to charge said control electrode to an initial voltage level prior to activation of said pulse source when said means for selectively interconnecting said second controlled electrode is connected to said pulse source having one of two potential levels.

* * * * *